United States Patent
Sonohara

(10) Patent No.: US 7,263,681 B2
(45) Date of Patent: Aug. 28, 2007

(54) SEMICONDUCTOR INTEGRATED CIRCUIT DEVICE AND LAYOUT METHOD OF PATTERNS FOR SEMICONDUCTOR INTEGRATED CIRCUIT DEVICE

(75) Inventor: Hideo Sonohara, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 303 days.

(21) Appl. No.: 10/609,572

(22) Filed: Jul. 1, 2003

(65) Prior Publication Data

US 2004/0006754 A1 Jan. 8, 2004

(30) Foreign Application Priority Data

Jul. 8, 2002 (JP) ............... 2002-199192

(51) Int. Cl.
*G06F 17/50* (2006.01)
(52) U.S. Cl. ............... 716/11; 716/9; 716/14; 716/17
(58) Field of Classification Search ............ 716/2, 716/6, 11, 15, 1, 9, 14, 17; 365/177
See application file for complete search history.

(56) References Cited

U.S. PATENT DOCUMENTS 5,150,325 A * 9/1992 Yanagisawa et al. ....... 365/177
5,341,049 A * 8/1994 Shimizu et al. ............. 326/101
5,654,931 A * 8/1997 Tamba et al. .......... 365/230.03
6,256,604 B1 * 7/2001 Yabe et al. .................... 703/14

FOREIGN PATENT DOCUMENTS

JP 4-171756 6/1992

OTHER PUBLICATIONS

I/O floorplanning Guide for SA-12 (International Business Machines Corporation, ASIC Products Application Note No. SA14-2309-00, 1998).

* cited by examiner

*Primary Examiner*—Thuan Do
(74) *Attorney, Agent, or Firm*—Young & Thompson

(57) ABSTRACT

A semiconductor integrated circuit device includes macros and area I/Os. The macros are arranged in optional locations of a first empty area of a gate area in a center portion of a chip, respectively. Each of the area I/Os contains a plurality of area I/O buffers, and is arranged in an optional location of a second empty area of a total area of the gate area and a buffer area in a circumferential portion of the chip. A first macro of the macros is connected with a specific one of the area I/Os. Here, the specific area I/O may be related to the first macro and be arranged in relation to a location for the first macro to be arranged.

16 Claims, 11 Drawing Sheets

SEMICONDUCTOR INTEGRATED CIRCUIT DEVICE AND LAYOUT METHOD OF PATTERNS FOR SEMICONDUCTOR INTEGRATED CIRCUIT DEVICE

BACKGROUND OF THE INVENTION

1. Field of the Invention

The present invention relates to a semiconductor integrated circuit device, especially to a semiconductor integrated circuit device in which degrees of freedom of the design can be improved.

2. Description of the Related Art

In the design of a semiconductor integrated circuit device, arrangement locations of an I/O buffer area and a gate area are previously determined. For example, the I/O buffer area is in the circumferential portion of a chip where the semiconductor integrated circuit device is formed, and the gate area is in the center portion of the chip surrounded by the I/O buffer area. I/O buffers, basic cells, and macros are arranged in predetermined areas in the design. For example, the I/O buffers are arranged in the I/O area and the basic cells and the macros are arranged in the gate area.

As a method of increasing the number of I/O buffers in the semiconductor integrated circuit device, various techniques are known. FIG. 1 is a plan view showing a pattern of the semiconductor integrated circuit device used in a conventional method of increasing the number of I/O buffers. Referring to FIG. 1, a chip A 101-1 where the semiconductor integrated circuit device is formed has a gate area 105-1 and a buffer area 103-1. The gate area 105-1 is provided for the center portion of the pattern for the semiconductor integrated circuit device and contains basic cells and macros. The buffer area 103-1 is provided to surround the gate area 105-1 over the whole circumferential portion of the semiconductor integrated circuit device and contains patterns for I/O buffers and pads 104. In this case, the I/O buffer patterns are arranged in the buffer area 103-1 as the circumferential portion of the chip.

When the number of I/O buffers is to be increased, the length of one side of the chip is made long, as shown in FIG. 1. That is, the chip size is made large as shown as a chip B 101-2 which has a gate area 105-2 and a buffer area 103-2. At this time, when the gate size is small, a dead space increases in the gate area 105-2.

In conjunction with the above description, a semiconductor integrated circuit device is disclosed in Japanese Laid Open Patent Application (JP-A-Heisei 4-171756). The semiconductor integrated circuit device of this conventional example has a gate area provided for the center portion of a semiconductor substrate and a buffer area provided in the circumferential portion of the semiconductor substrate. The buffer area is divided into a plurality of buffer area portions along the circumference, and two of the buffer area portions are separated by a predetermined distance. FIG. 2 is a plan view showing the pattern of the semiconductor integrated circuit device of this conventional example. Referring to FIG. 2, a chip 111 where the semiconductor integrated circuit device is formed has a gate area 115 and a buffer area which are connected by signal lines 112. The buffer area has a plurality of buffer portions, each of which is separated into groups 113. The buffer areas portions 113 are provided in the outermost circumferential buffer area portion of the chip 111 without any space and patterns of many I/O buffers are arranged in a line in the buffer area portions 113. This technique has a purpose of increasing the number of I/O buffers which can be arranged in the same substrate area or reducing the substrate area. However, when the plurality of buffer area portions for the I/O buffers are arranged to increase the number of the I/O buffers, the buffer area portions 113 in the inner circumferential portion expands and the area usable for the gate area 115 reduces.

Also, "I/O floorplanning Guide for SA-12" (International Business Machines Corporation, ASIC Products Application Note No. SA14-2309-00, 1998) is known. FIG. 3 is a schematic plan view showing a pattern for a semiconductor integrated circuit device of this conventional example. The semiconductor integrated circuit device pattern has area I/Os 126 arranged in a matrix and gate areas 125 provided between the rows of the area I/Os 126 on a chip 121 for the semiconductor integrated circuit device. The chip 121 is for a flip chip, and does not have to provide I/O buffers in the circumferential portion. The chip 121 uses the area I/Os 126 as the I/O buffers provided in the area. A possible arrangement area of the area I/Os 126 is predetermined, and the number of I/O buffers is increased if necessary.

As described above, an area in which the area I/Os 126 can be arranged is limited. Therefore, in case that a large macro is arranged when the number of the I/O buffers is increased, the area I/Os 126 must be reduced. Therefore, the number of signals possible to be process corresponding to the number of I/O buffers is reduced. Also, it is necessary to arrange a basic cell in a little distance from the I/O buffer in consideration of influences such as latch up when the basic cell is arranged in the neighborhood of the I/O buffer. Therefore, when all the I/O buffers are arranged in the area I/Os 126, a dead space increases and the gate area 125 decreases.

SUMMARY OF THE INVENTION

Therefore, an object of the present invention is to provide a semiconductor integrated circuit device and a layout method of the semiconductor integrated circuit device in which degrees of freedom of the design is increased.

Also, another object of the present invention is to provide a semiconductor integrated circuit device and a layout method of the semiconductor integrated circuit device in which it is possible to increase the number of I/O buffers while generation of a dead space is restrained and increase of a substrate area is restricted.

In an aspect of the present invention, a semiconductor integrated circuit device includes macros and area I/Os. The macros are arranged in optional locations of a first empty area of a gate area in a center portion of a chip, respectively. Each of the area I/Os contains a plurality of area I/O buffers, and is arranged in an optional location of a second empty area of a total area of the gate area and a buffer area in a circumferential portion of the chip. A first macro of the macros is connected with a specific one of the area I/Os. Here, the specific area I/O may be related to the first macro and be arranged in relation to a location for the first macro to be arranged.

Also, the semiconductor integrated circuit device may further include a peripheral I/O provided in a fixed area of the buffer area, and containing a plurality of peripheral I/O buffers. A specific one of the plurality of peripheral I/O buffers may be connected with a second macro of the macros. Also, a plurality of logic gates may be provided in optional locations of the first empty area of the gate area.

Also, each of the macros may be arranged depending on one of signal processing speed, heat generated in the chip during an operation of the semiconductor integrated circuit device, and connection relation between the macro and remaining macros.

In another aspect of the present invention, a design apparatus of a semiconductor integrated circuit may include a macro table, a selection section and a layout design section. The macro table stores macro data and specification data. The macro data specifies each of a plurality of macros, and the specification data specifies an area I/O corresponding to each of the plurality of macros. The area I/O contains a plurality of I/O buffers and is possible to be arranged in an optional location of a first empty area of a gate area and a circumferential portion on a chip surrounding the gate area. The selection section refers to the macro table based on data for specifying each of a plurality of design macros and process data for specifying whether the macro needs to carry out high-speed signal processing, to select a high-speed processing macro and the area I/O related to the high-speed macro. The layout design section arranges the high-speed processing macro and the area I/O in predetermined locations on a chip such that the high-speed macro is arranged in a second empty area of the gate area and the area I/O is arranged in the first empty area of the gate area and the buffer area.

Here, the area I/O contains the number of I/O buffers in the area I/O, an arrangement of the I/O buffers and an optimal arrangement of the area I/O and the high-speed processing macro.

Also, in another aspect of the present invention, a layout method of a semiconductor integrated circuit device, may be achieved by selecting a high-speed processing macro, in which a signal needs to be processed at high speed, and an area I/O related to the high-speed processing macro based on design macro data of each of a plurality of design macros to be laid-out and specification data for specifying whether the design macro is the high-speed processing macro; and by arranging the high-speed processing macro the area I/O on a chip which has a gate area in a center portion and a buffer area in a circumferential portion.

Here, the selecting step may be achieved by referring to a macro table based on the design macro data and the specification data to select the high-speed processing macro and the area I/O. The macro table stores macro data and specification data, wherein the macro data specifies each of a plurality of macros, and the specification data specifies an area I/O corresponding to each of the plurality of macros. Also, the area I/O contains the number of I/O buffers in the area I/O, an arrangement of the I/O buffers and an optimal arrangement of the area I/O and the high-speed processing macro. The arranging step may be achieved by arranging the high-speed processing macro in a first empty area of the gate area and the area I/O is arranged in a second empty area of the gate area and the buffer area based on the optimal arrangement.

In another aspect of the present invention, a software product executable by a computer for a layout method of a semiconductor integrated circuit device, the layout method may be achieved by selecting a high-speed processing macro, in which a signal needs to be processed at high speed, and an area I/O related to the high-speed processing macro based on design macro data of each of a plurality of design macros to be laid-out and specification data for specifying whether the design macro is the high-speed processing macro; and by arranging the high-speed processing macro the area I/O on a chip which has a gate area in a center portion and a buffer area in a circumferential portion. Also, the selecting step may be achieved by referring to a macro table based on the design macro data and the specification data to select the high-speed processing macro and the area I/O. The macro table stores macro data and specification data, wherein the macro data specifies each of a plurality of macros, and the specification data specifies an area I/O corresponding to each of the plurality of macros.

In another aspect of the present invention, a semiconductor integrated circuit device includes macros, area I/Os, and a peripheral I/O. The macros are arranged in optional locations of a first empty area of a gate area in a center portion of a chip, respectively. Each of the area I/Os contains a plurality of area I/O buffers, and is arranged in an optional location of a second empty area of a total area of the gate area and a buffer area in a circumferential portion of the chip. The peripheral I/O is provided in a fixed area of the buffer area, and containing a plurality of peripheral I/O buffers. A first macro of the macros is connected with a specific one of the area I/Os, and a specific one of the plurality of peripheral I/O buffers is connected with a second macro of the macros.

Also, the specific area I/O may be related to the first macro and may be arranged in relation to a location for the first macro to be arranged. Also, a plurality of logic gates may be provided in optional locations of the first empty area of the gate area.

Also, each of the macros may be arranged depending on one of signal processing speed, heat generated in the chip during an operation of the semiconductor integrated circuit device, and connection relation between the macro and remaining macros.

DESCRIPTION OF THE PREFERRED EMBODIMENTS

Hereinafter, a semiconductor integrated circuit device and a layout method of the semiconductor integrated circuit device of the present invention will be described with reference to the attached drawings.

Figure 4:
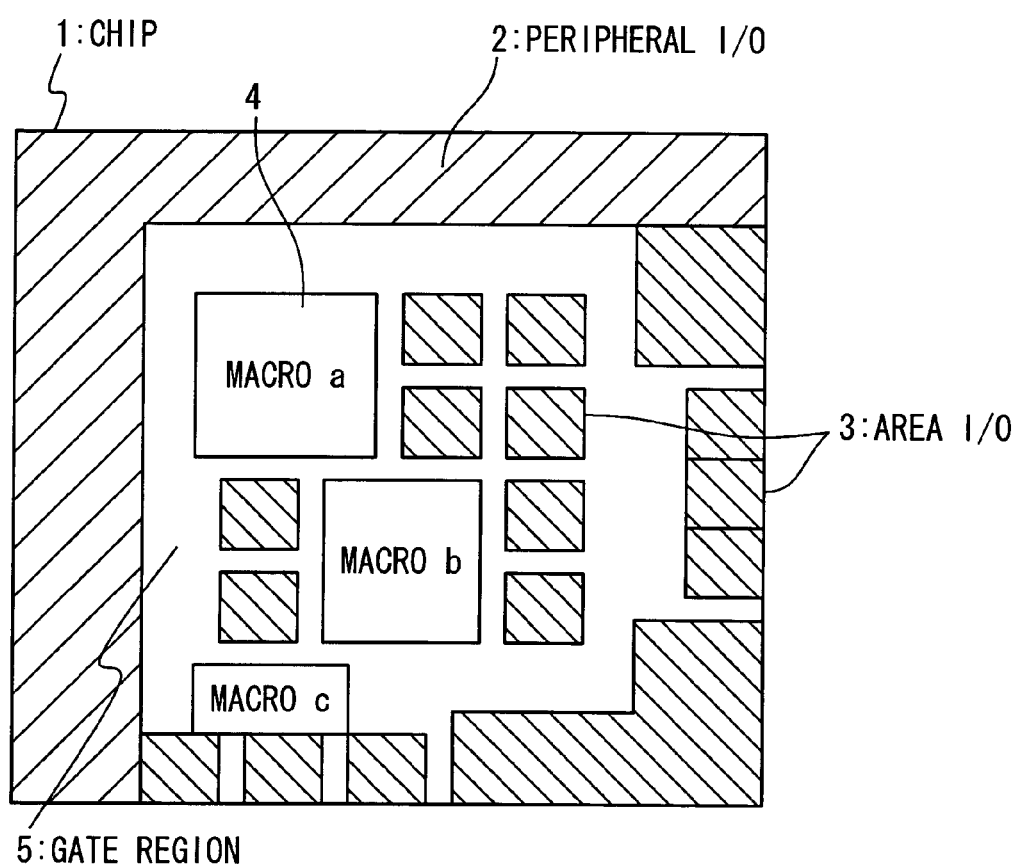
FIG. 4 is a schematic plan view showing a pattern of a semiconductor integrated circuit device according to an embodiment of the present invention.

FIG. 4 is a schematic plan view showing a pattern of the semiconductor integrated circuit device according to the first embodiment of the present invention. However, the present invention is not limited to this arrangement. Referring to FIG. 4, a chip 1 where the semiconductor integrated circuit device is formed contains a gate area 5 and a buffer area. The buffer area contains a peripheral I/O 2 buffer area and area I/O 3 buffer area.

The gate area 5 is provided onto the chip 1. The gate area contains basic cells, macros 4, and logic gates. The gate area 5 may be provided in the circumferential portion of the chip 1 in addition to the center portion. Here, the basic cell is a set of transistor elements for forming a gate. The macro 4 is a core or a large basic cell which has a predetermined function like a CPU, a RAM, a ROM, and a multiplier. The macro 4 is connected with a specific one of the area I/Os 3 or some of I/O buffers of the peripheral I/O 2 by wiring lines. The macro 4 may be provided in the circumferential portion in addition to the center portion of the chip 1.

The peripheral I/O 2 buffer area is fixedly provided for a part of the circumferential portion of the chip 1. The peripheral I/O 2 is formed in the peripheral I/O 2 buffer area. In the peripheral I/O 2, the peripheral I/Os are continuously provided in the whole area of the peripheral I/O 2 buffer area without a space. The peripheral I/O 2 contains, in addition to the I/O buffers, pads such as signal pads, power supply pads for the I/O buffers, and ground pads for the I/O buffers. There is a case that a part of the gate area overlaps with the peripheral I/O buffer area 2 on the pads provided for the circumferential portion of the peripheral I/O buffer area. At this time, there is a case that the part of the gate area may be in another layer.

The area I/O buffer area 3 can be provided freely onto the chip 1 and may be provided in a part of the circumferential portion of the chip 1. The area I/O 3 buffer area contains an area I/O 3, which may contain I/O buffers and pads such as signal pads, power supply pads for the I/O buffers, ground pads for the I/O buffers, connection wiring lines. The area I/O 3 buffer area may be provided in the circumferential portion of the chip depending on the design of the semiconductor integrated circuit device in addition to the center portion of the chip 1. Also, the size of the area I/O buffer area 3 is variable depending on the design. There is a case that a part of the gate area 5 overlaps with the area I/O buffer area 3 on the pads in the circumferential portion of the area I/O 3 buffer area. In this case, however, the gate area 5 may be in a different layer from the area I/O buffer area. Here, the basic cell is connected with the area I/O 3 or the peripheral I/O 2.

In this way, the pad patterns can be provided for an inner area of the chip 1 in addition to the circumferential portion of the chip 1. A flip chip is exemplified as the chip. Also, the semiconductor integrated circuit device in the first embodiment has the gate area 5 and a buffer area which contains the peripheral I/O 2 buffer area and the area I/O 3 buffer areas. However, the gate area 5 and the buffer area are not predetermined in the arrangement locations and can be arranged freely. That is, a set of one macro 4 and area I/Os relating to the macro 4 is prepared as a design unit, and the area I/O may contain I/O buffers, signal pads, power supply pads for the I/O buffer, ground pads for the I/O buffer, and connection wiring lines for connecting the I/O buffer and each pad. Hereinafter, the set is referred to as a "macro with area I/Os". It should be noted that a circuit block combined with the macro 4 may be peripheral I/Os 2 instead of the area I/Os 3. The macro 4 may be combined with the peripheral I/O 2 and the area I/O 3.

Thus, it is easily realized to automatically arrange the macro with the area I/Os in an optional location on the chip 1. Also, by using both of the peripheral I/O 2 buffer area and the area I/O 3 buffer areas, it is possible to increase the number of I/O buffers or the number of signals to be processed, while the increase of a dead space is restrained.

As shown in FIG. 4, in this semiconductor integrated circuit device, the peripheral I/O 2 buffer area and the area I/O 3 buffer areas are realized on the same chip 1. Some of the area I/O 3 buffer areas are arranged in the gate area 5 of the center portion of the chip. The area I/O 3 buffer area can be arranged in the neighborhood of the macro 4 (core). Also, the neighborhood of the area I/O 3 buffer area can be used as the gate area 5. The I/O buffers in the peripheral I/O 2 are arranged in the circumferential portion without any space. That is, it is possible to increase the number of I/O buffers or the number of signals to be processed, using the combination of the peripheral I/O 2 buffer area and the area I/O 3 buffer areas, while suppressing a dead space.

Also, the buffer area of the area I/O 3 used for one of the macros 4 or one of the basic cells which is necessary to input and output a signal at high speed (for example, equal to or more than 500 MHz) may be arranged in the neighborhood of the macro 4 or the basic cell. The macros 4 and the basic cells other than the above macro or basic cell are arranged in another portion of the gate area 5. Thus, it is possible to improve a signal processing rate on the chip 1. In addition, a signal delay can be improved so that it becomes easy to adjust the timings of the input and output of the signal.

Next, an example of a specific pattern structure of the semiconductor integrated circuit device will be described. It should be noted that it is supposed that the area sizes of the chips shown in FIGS. 5 to 8 are equal to each other and the number of pads for one side is 29 and is common to these chips. Also, the present invention is not limited to the pattern structure of FIGS. 5 to 8. The present invention is applicable even when the size of the I/O buffer on the chip and the arrangement structure of the pads (lattice form, or staggered form), and the pad pitch are changed.

Figure 5:
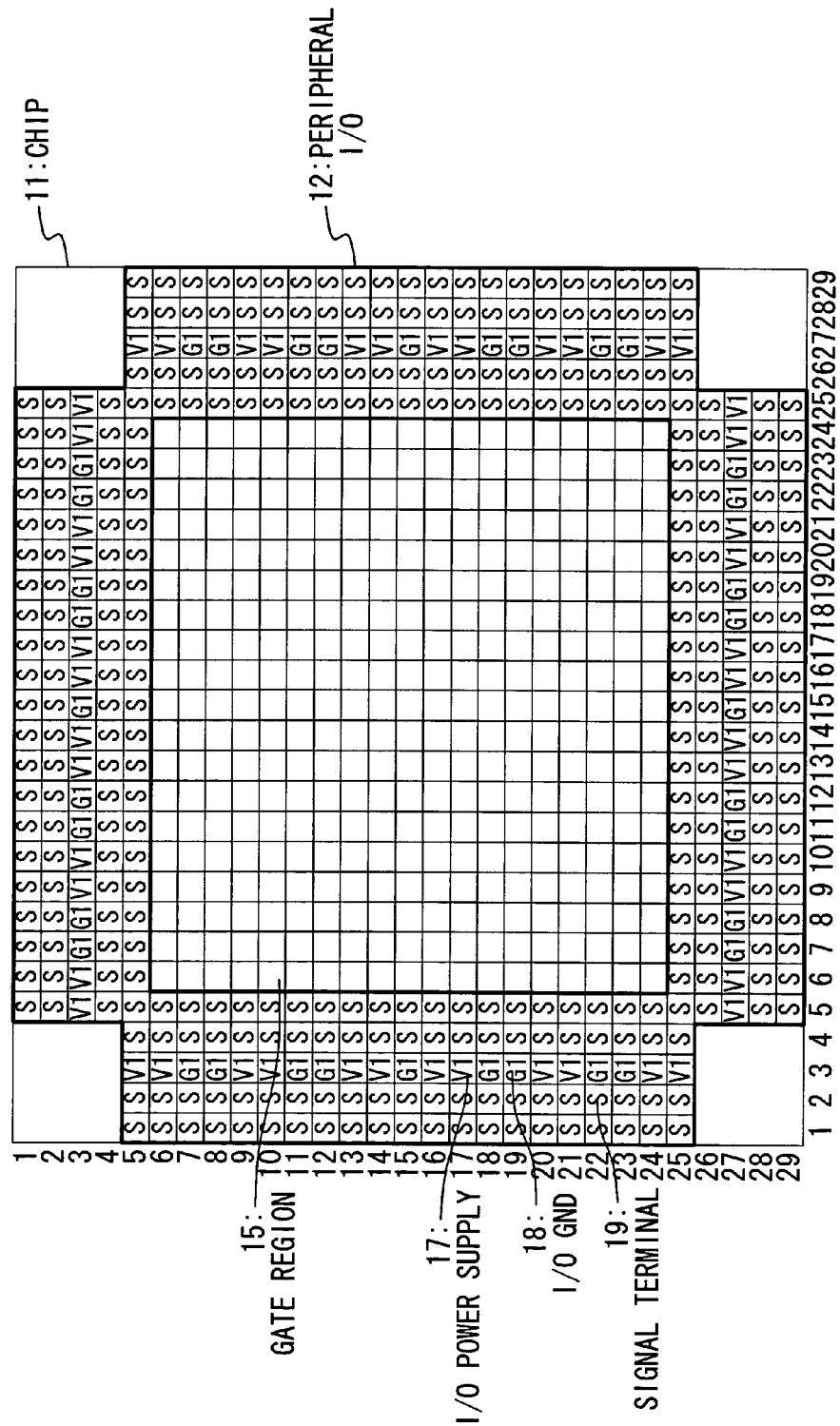
FIG. 5 is a diagram showing an example of a specific pattern of the semiconductor integrated circuit device in the first embodiment.

FIG. 5 shows the chip 11 which has a peripheral I/O buffer area 12 and a gate area 15, but does not have the area I/O buffer area. This structure is similar to the conventional example shown in FIG. 1.

The peripheral I/O 12 contains an I/O power supply 17 as a power supply pad for the I/O buffer (shown as V1 in the figure and same hereinafter), an I/O GND 18 as a ground pad for the I/O buffer (shown as G1 in the figure and same hereinafter), and a signal terminal 19 as a signal pad (shown as S in the figure and same hereinafter). The number of signal terminals 19 corresponds to the number of pins in the chip 11. In FIG. 5, there are 332 pins. The other functions of the gate area 15 and the peripheral I/O 12 are same as those of the gate area 5 and the peripheral I/O 2 in FIG. 4.

Figure 6:
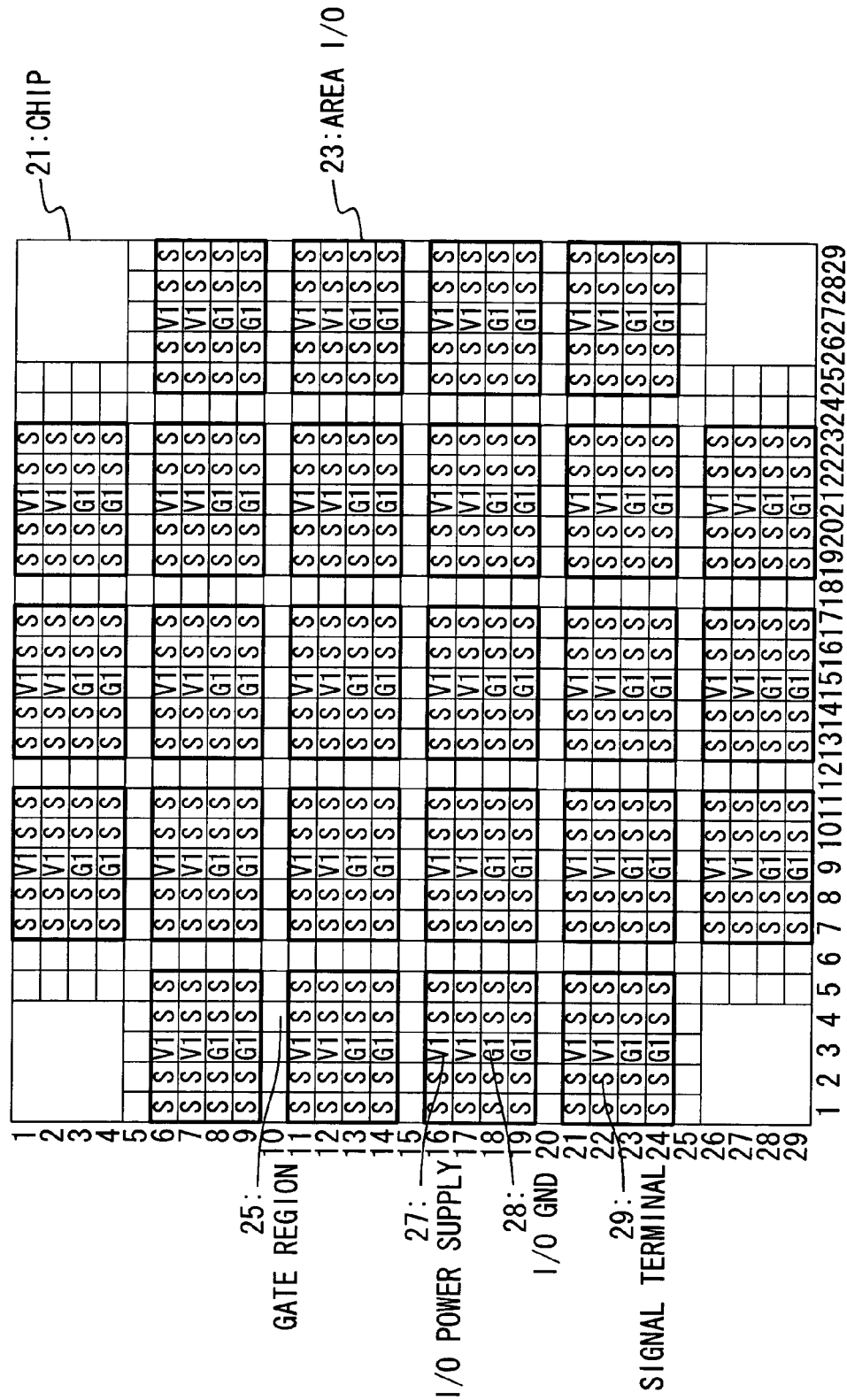
FIG. 6 is a diagram showing an example of another specific structure of the semiconductor integrated circuit device in the first embodiment.

FIG. 6 shows a chip 21 which has area I/O buffer areas, but does not the peripheral I/O. The chip 21 has buffer areas for the area I/Os 23 and a gate area 25. The area I/O 23 contains an I/O power supply 27 as a power supply pad (V1) for the I/O buffer, a signal terminal 29 as an I/O GND 28 as a ground pad (G1) for the I/O buffer, and a signal pad (S). The number of signal terminals 29 corresponds to the number of the pins in the chip 21. In FIG. 6, there are 416 pins. The chip 11 of FIG. 5 and the chip 21 of FIG. 6 have the same area. That is, the number of pins in FIG. 6 is 1.25 times more than that of FIG. 5 and the number of I/O buffers or the number of signals increases even in the same area. The other functions of the gate area 25 and the buffer areas for the area I/Os 23 are same as those of the gate area 5 and the buffer areas for the area I/O 3 of FIG. 4.

Figure 7:
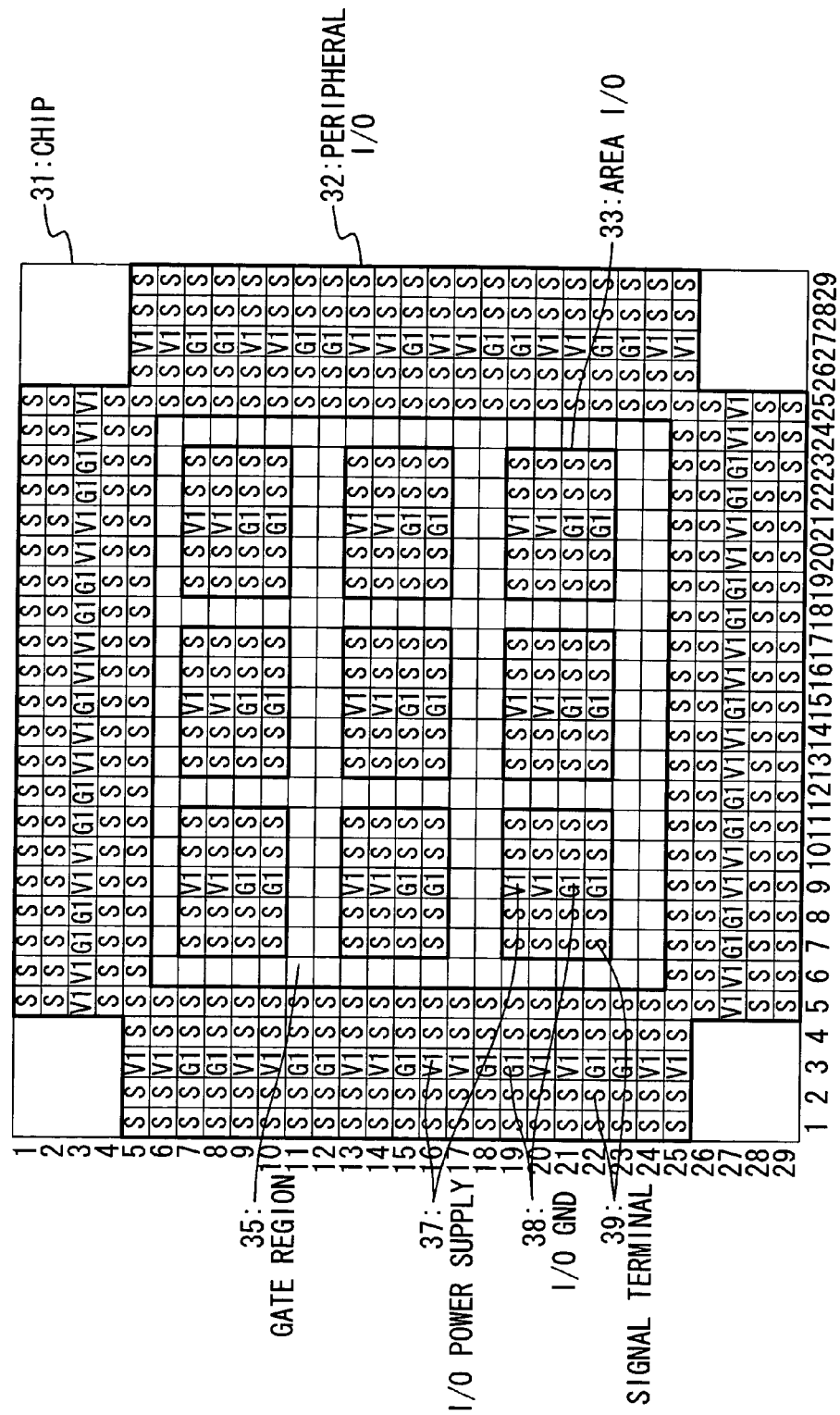
FIG. 7 is a diagram showing an example of another specific structure of the semiconductor integrated circuit device in the first embodiment.

FIG. 7 shows a chip 31 which has buffer areas for area I/Os 33, a buffer area for peripheral I/Os 32 and a gate area 35. The peripheral I/O 32 and the area I/O 33 contain an I/O power supply 37 as a power supply pad (V1) for the I/O buffer, a signal terminal 39 as an I/O GND 38 as a ground pad (G1) for the I/O buffer, and a signal pad (S). The other functions of the gate area 35, the buffer area for the peripheral I/Os 32 and the buffer areas for the area I/Os 33 are same as the gate area 5, the buffer area for the peripheral I/Os 2 and the buffer areas for the area I/O 3 in FIG. 4. The number of signal terminals 39 corresponds to the number of the pins in the chip 31. In FIG. 7, there are 476 pins. The chip 11 of FIG. 5 and the chip 31 of FIG. 7 have the same area. That is, the number of pins of FIG. 7 is 1.43 times more than that of FIG. 5 and the number of I/O buffers or the number of signals increases even in the same area.

Figure 8:
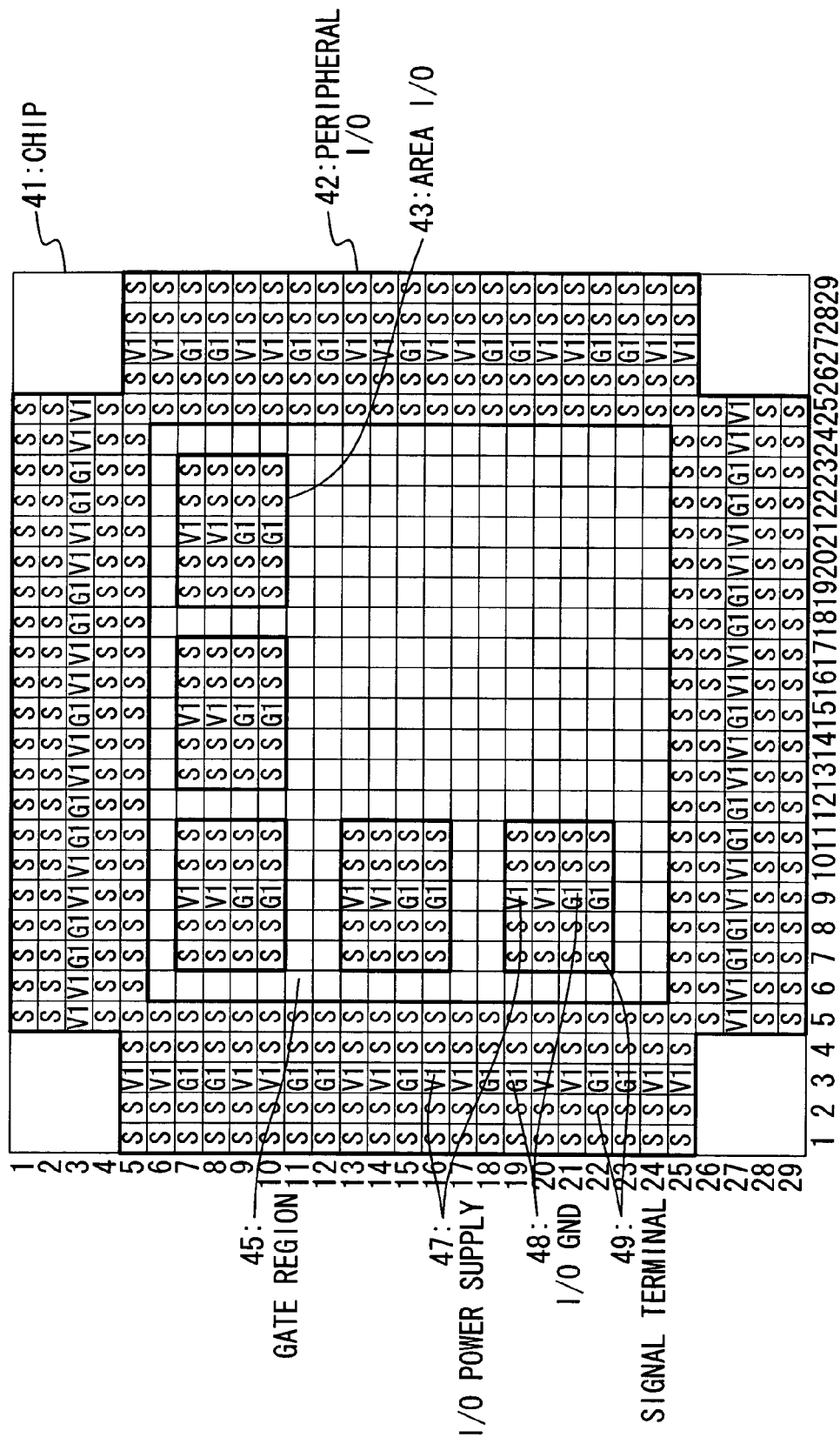
FIG. 8 is a diagram showing an example of another specific structure of the semiconductor integrated circuit device in the first embodiment.

FIG. 8 shows a chip 41 which has the buffer areas for the area I/Os 43, the buffer area for the peripheral I/Os 42, and a gate area 45. Tn this case, the gate areas 45 is increased and the number of area I/Os 43 are decreased, comparing with a case of FIG. 7. The peripheral I/O 42 and the area I/O 43 contain an I/O power supply 47 as a power supply pad (V1) for the I/O buffer, a signal terminal 49 as a signal pad (S), and an I/O GND 48 as a ground pad (G1) for the I/O buffer. The other functions of the gate area 45, peripheral I/O 42 buffer area and area I/O 43 buffer areas are same as the gate area 5, peripheral I/O 2 and area I/O 3 of FIG. 4. The number of signal terminals 49 corresponds to the number of the pins in the chip 41. In FIG. 8, there are 412 pins. The chip 11 of FIG. 5 and the chip 41 of FIG. 8 have the same area. That is, the number of pins of FIG. 8 is 1.24 times more than that of FIG. 5 and the number of I/O buffers or the number of signals increases even in the same area.

Figure 1:
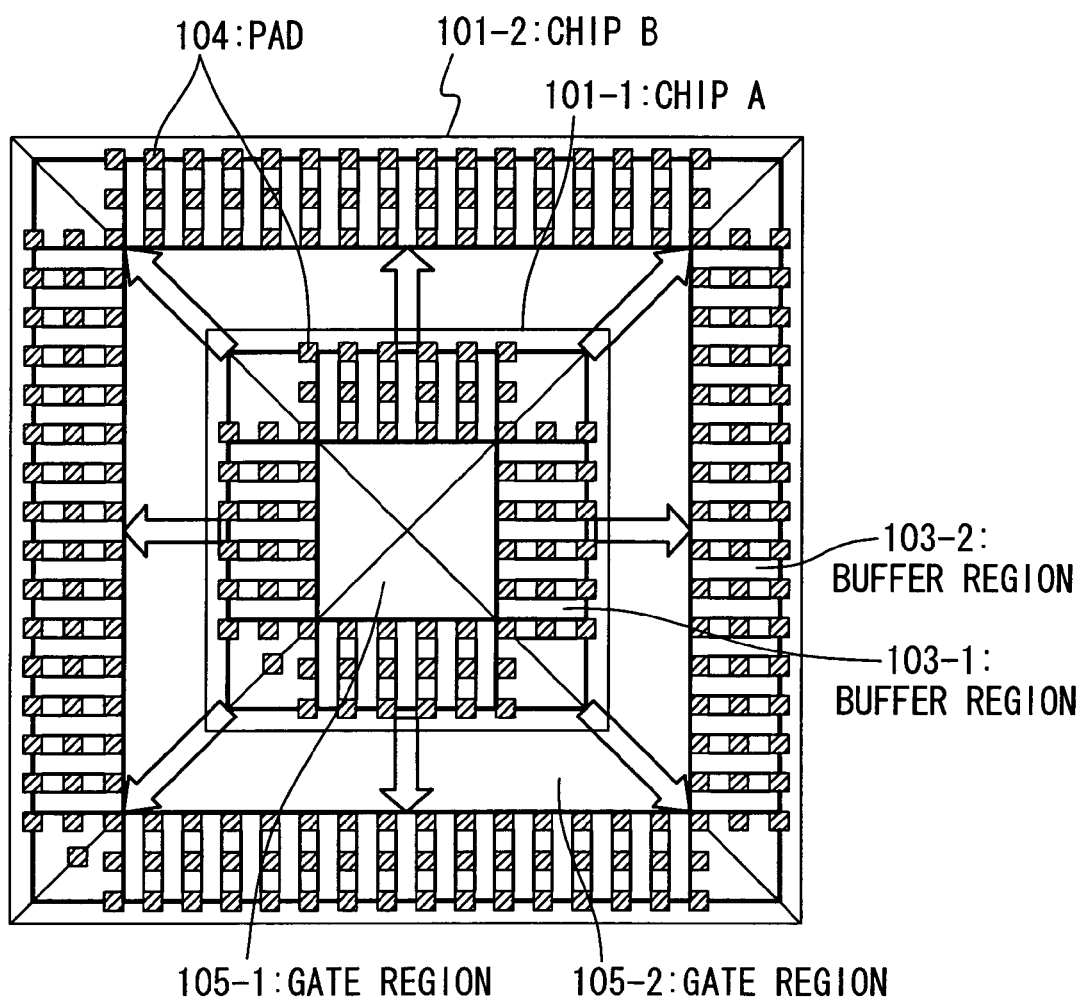
FIG. 1 is a plan view showing a pattern for a conventional semiconductor integrated circuit device.
Figure 2:
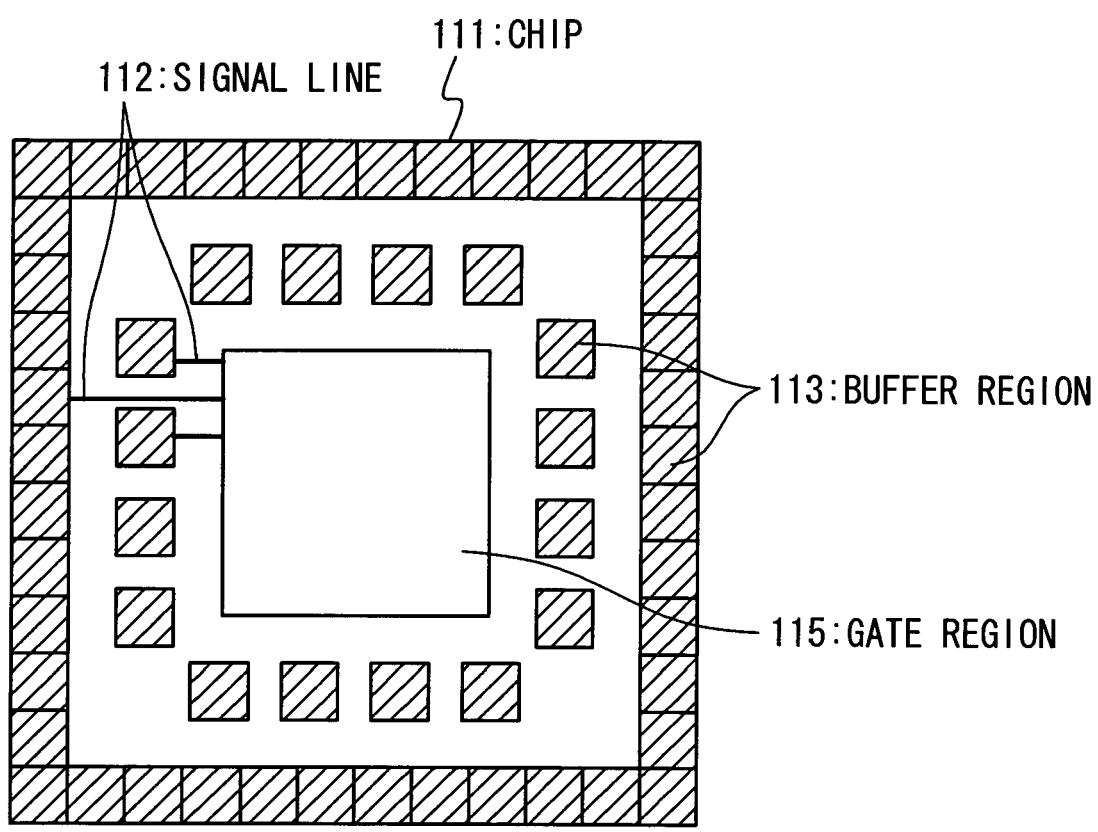
FIG. 2 is a plan view showing a pattern for another conventional semiconductor integrated circuit device.
Figure 3:
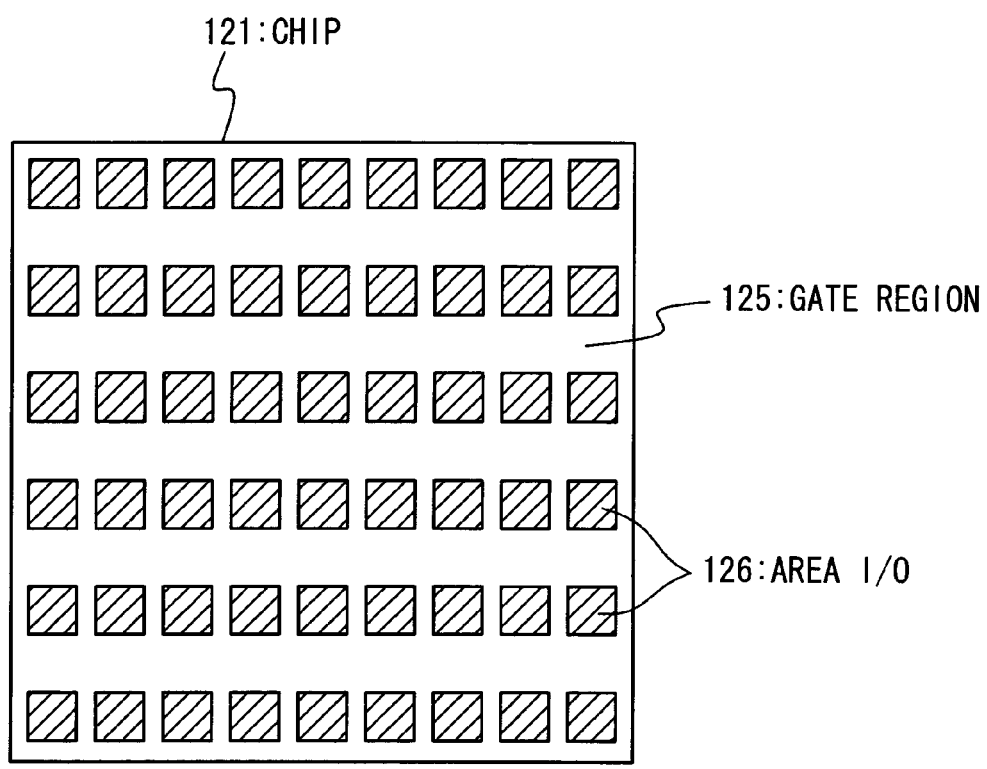
FIG. 3 is a schematic plan view showing a pattern for another conventional semiconductor integrated circuit device.

In the gate area 15, 105 where a basic cell is arranged in the conventional examples as shown in FIG. 5 and FIG. 1, an area I/O 23, 33, 43 is arranged as shown in FIGS. 6 to 8. By using the peripheral I/O 32, 42, a signal density for a unit area or the number of I/O buffers can be increased largely. Also, the chip size can be reduced by moving a part of the peripheral I/O as the area I/O to the empty area in the gate area.

Figure 9:
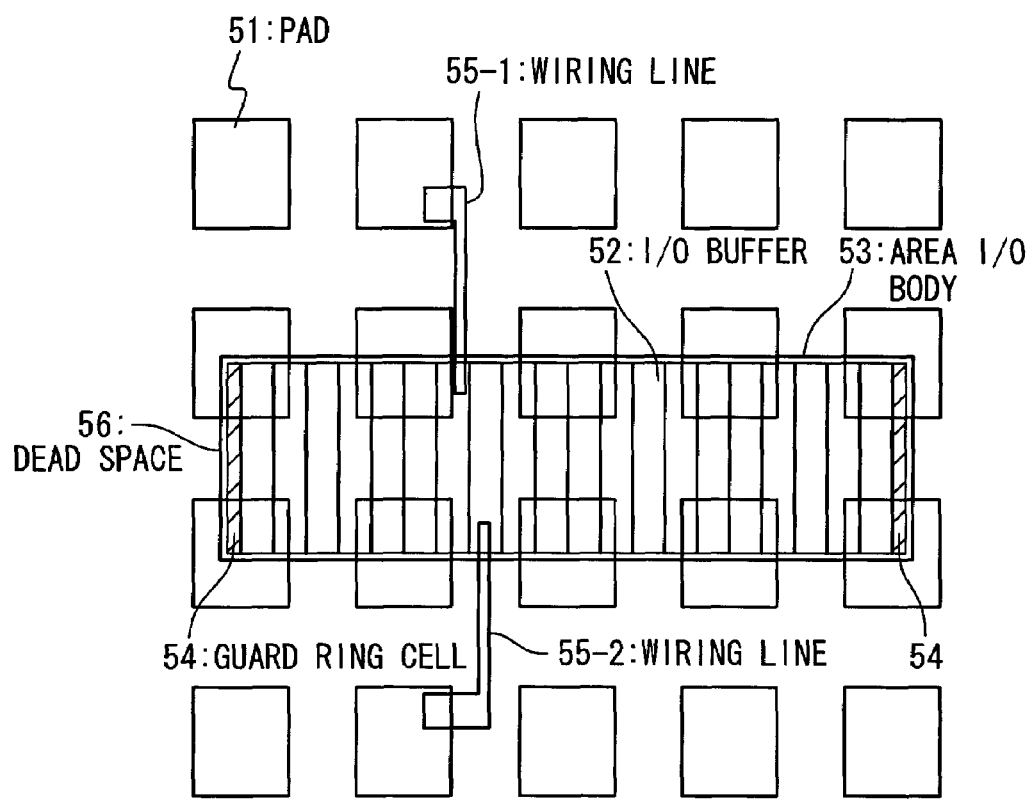
FIG. 9 is a diagram showing an example of a part of the structure of an area I/O.

FIG. 9 is a diagram showing an example of a part of the structure of the area I/O. The area I/O is composed of pads 51, I/O buffers 52, an area I/O body 53, guard ring cells 54, wiring lines 55 (−1 to −2), and a dead space 56. Each of the pads 51 is a signal pad, a power supply pad for the I/O buffer or a ground pad for the I/O buffer (In FIG. 9, they are not clearly shown). Each of the pads 51 is connected with one of the I/O buffers 52 by the wiring line 55. It should be noted that only the wiring line 55-1 and the wiring line 55-2 are shown as the wiring line 55 in FIG. 9. The area I/O body 53 contains the I/O buffers 52 and the guard ring cells 54. Although the basic cell or the macro in the gate area is formed in the same layer as the area I/O body 53, the area I/O body 53 is separated from the basic cell or the macro (not shown) by the dead space 56. The pads 51 in the area I/O and a part of the basic cell or the macro are in different layers and overlap with each other. The guard ring cells 54 are provided for the both edges of the area I/O body 53 for the latch up measurement.

Figure 10:
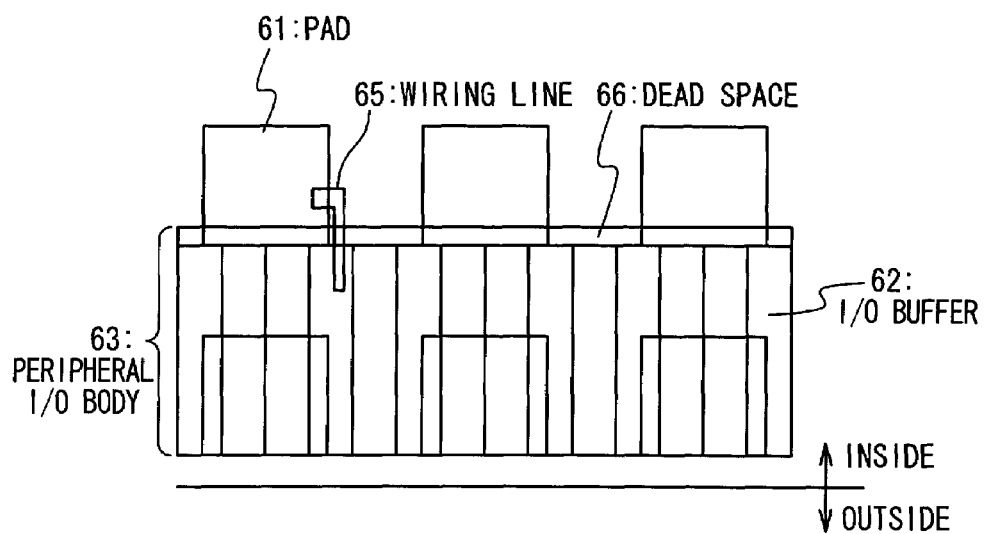
FIG. 10 is a diagram showing an example of a part of the structure of a peripheral I/O.

FIG. 10 is a diagram showing an example of a part of the structure of the peripheral I/O. The peripheral I/O is composed of pads 61, I/O buffers 62, a peripheral I/O body 63, wiring lines 65, and a dead space 66. The pads 61 are same as the pad 51. Each of the pads 61 is connected with one of the I/O buffers 62 by the wiring line 65. It should be noted that only one of the wiring lines 65 is shown in FIG. 10. The peripheral I/O body 63 contains the I/O buffers 62 and is separated from a basic cell or a macro (not shown) provided in the central portion of the chip by the dead space 66. That is, the basic cell or macro in the gate area is in the same layer as the peripheral I/O body 63. Also, the pads 61 of the peripheral I/O and a part of the basic cell or macro are in different layers and overlap with each other.

Generally, a space is necessary between the I/O buffer 52 or 62 and the basic cell or macro. Therefore, it is necessary to provide the dead space 56 or 66 as shown in FIG. 9 or 10. The basic cells or macros are arranged around the area I/O body 53. Therefore, when many area I/O bodies 53 are used, a total area of the dead spaces 56 is larger than a total area of the dead spaces 66. Also, the guard ring cells 54 are arranged in the both edges of the area I/O body 53. Therefore, the I/O buffer arrangement area is necessary more widely than the peripheral I/O body 63.

The dead spaces were calculated from the chip of FIG. 6 and the chip of FIG. 8 in which the number of signal pins is approximately the same. The calculation results are shown below. It is supposed that the I/O buffer size is 250 μm×50 μm, the guard ring cell size is 250 μm×20 μm, the pad pitch is 250 μm, and the interval between the I/O buffer and the basic cell is 10 μm.

Case of FIG. 6 (Only the area I/O): 681,200 μm$^2$

Case of FIG. 8 (peripheral I/O+area I/O): 341,000 μm$^2$

That is, in case of FIG. 8, the dead space can be restrained to about ½, compared with the case of FIG. 6. Therefore, if the use of many area I/Os is avoided through the combination of the peripheral I/O and the area I/O, the dead space can be restrained. By restraining the dead space, the number of the signals or the number of the I/O buffers for a unit area can be increased.

Next, a layout method of the semiconductor integrated circuit device according to the embodiment of the present invention will be described.

Figure 11:
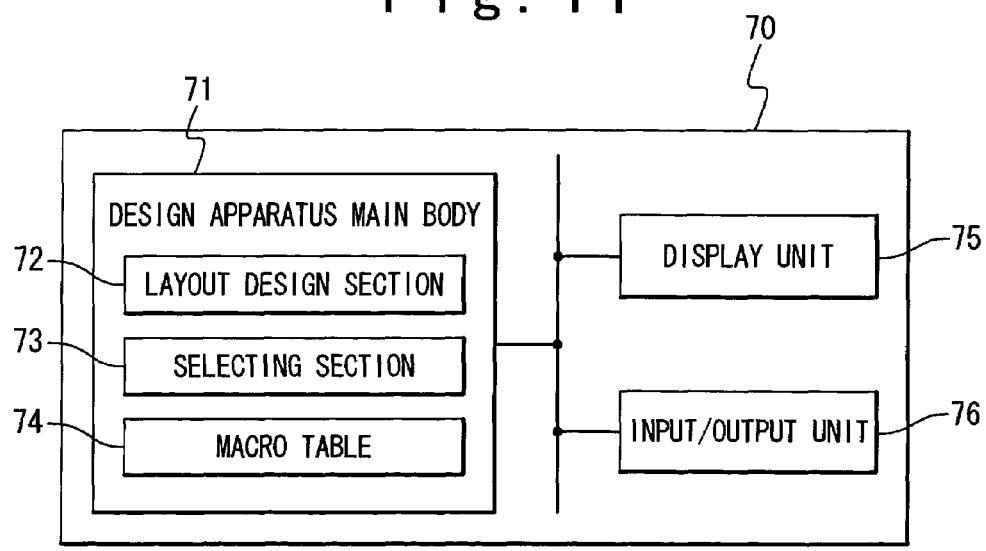
FIG. 11 is a diagram showing the structure of a design apparatus of the semiconductor integrated circuit device.

FIG. 11 is a diagram showing the structure of a design apparatus to which the layout method of the semiconductor integrated circuit device is applied. The design apparatus 70 is composed of a design apparatus body 71, a display unit 75 and an input/output unit 76. The design apparatus body 71 is an information processor which is exemplified as a work station. The design apparatus body 71 is connected with the input/output unit 76 and the display unit 75. The input/output unit 76 carries out input of data necessary for data processing and output of data processing result, and the display unit 75 displays input and output contents and so on. The design apparatus body 71 is composed of a layout design section 72 as a program, a selection section 73 and a macro table 74.

The macro table 74 stores macro data and data of the area I/Os 3 used for the macros 4. For example, the macro data contains names and kinds of macros. Also, for example, the area I/O data contains the number and arrangement of I/O buffers, the number and arrangement of signal pads related to the I/O buffers, power supply pads for the I/O buffers and ground pads for the I/O buffers, a wiring line which connects the I/O buffer and each pad, and optimal arrangement of the area I/O 3 and the macro 4).

The selection section 73 refers to the macro table 74 based on data of a design macro and specification data, containing a macro name and a kind of the macro, and used to specify a macro which needs high-speed processing of a signal to select a high-speed processing macro 4 and an area I/O 3 combined with the high-speed processing macro 4. Thus, a set of the macro and the area I/O is generated.

The layout design section 72 carries out the layout design to arrange the set of the macro and the area I/O in a predetermined location on the chip 1. Also, the layout design section 72 contains an automatic design program which is conventionally known, and the layout design section 72 can carry out the automatic design of the chip based on the above-mentioned layout design.

Figure 12:
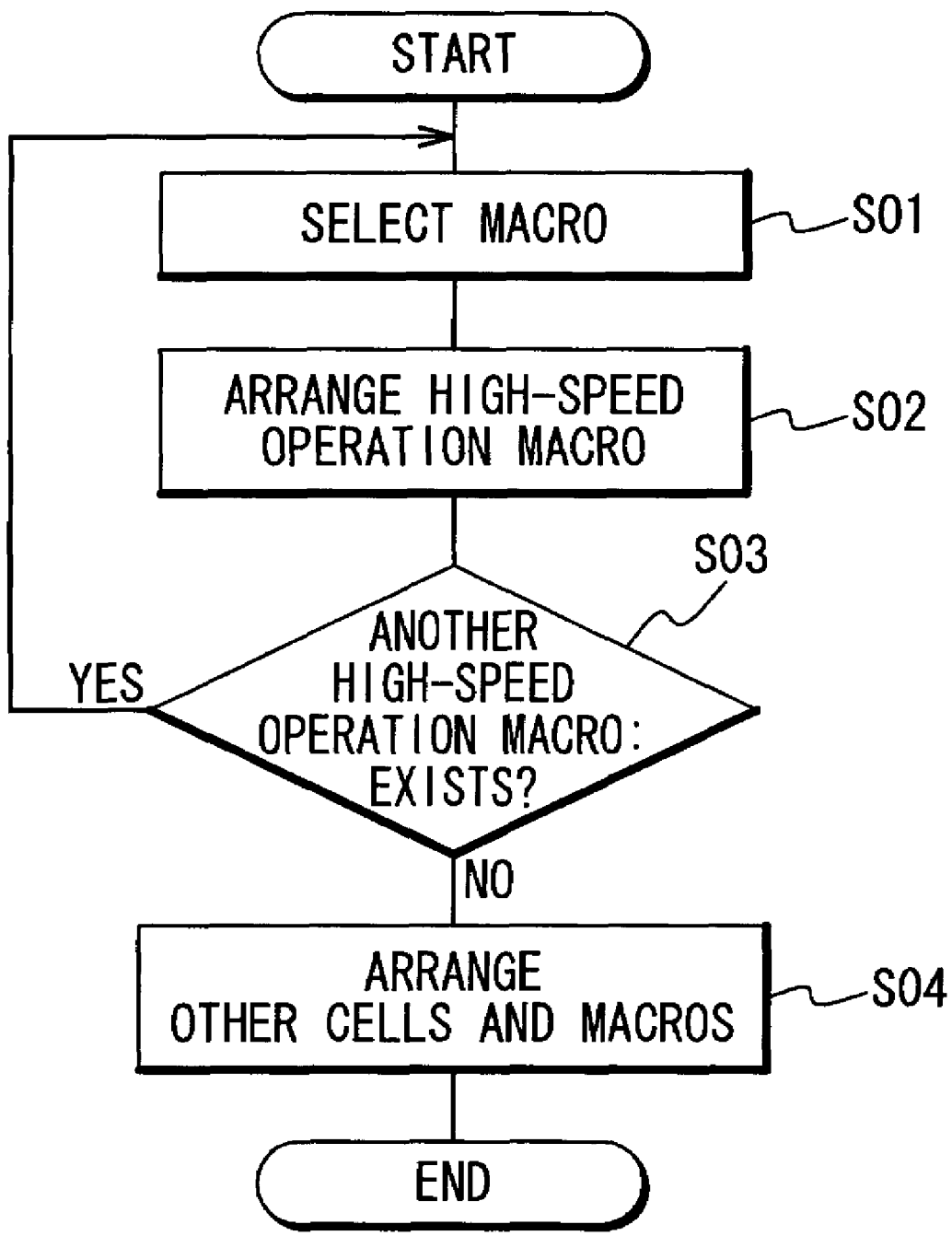
FIG. 12 is a flow chart showing the layout method the semiconductor integrated circuit device according to the embodiment of the present invention.

Next, the layout method of the semiconductor integrated circuit device according to the embodiment of the present invention will be described. FIG. 12 is a flow chart showing the layout method of the semiconductor integrated circuit device according to the embodiment of the present invention.

(1) Step S01

A designer inputs from the input/output unit 76, data about the kinds of a plurality of design macros 4 used to design the chip 1, and the specification data as the data for specifying the high-speed processing macro of the design macros 4. The specification data contains the macro name, and the macro kind. However, the high-speed processing macro may be specified using the characteristics of the processing speed (for example, 500 MHz) or a priority when the macro is arranged on the chip 1.

The selection section 73 refers to the macro table 74 based on the plurality kinds of macros 4 and the specification data to selects a high-speed processing macro 4 which needs to input and output a signal at high speed. Then, the selection section 73 takes out an area I/O which contains the number and arrangement of the I/O buffers to be used for the high-speed processing macro 4 from the macro table 74. The selection section 73 prepares the high-speed processing macro 4 and the area I/O 3 relating to the high-speed processing macro 4 as a set which is a unit in case of the design.

(2) Step S02

The layout design section 72 arranges the set of the high-speed processing macro and the area I/O in a location of the gate area 5 suitable for the high-speed signal processing. The layout design section 72 displays the layout result on the display unit 75. The designer can move the high-speed processing macro and the area I/O to optional locations of the gate area 5, viewing the displayed arrangement result.

(3) Step S03

The layout design section 72 checks whether another high-speed processing macro exists in the design macros. If there is not high-speed processing macro exists in the design macros, the layout design section checks whether a middle-speed processing macro exists in the design macros. If there is the middle-speed processing macro exists in the design macros, the layout design section 72 selects the middle-speed processing macro and an area I/O relating the middle-speed macro, through the operation similar to the step S01.

Then, the layout design section 72 arranges the set of the selected middle-speed processing macro and the selected area I/O in desired locations of an empty area of the gate area like the step S02.

(4) Step S04

The designer inputs other macros 4, basic cells and so on which are necessary to design the chip 1. The layout design section 72 arranges the other macros 4 or basic cells in the remaining empty area of the gate area. In this case, it is possible to use a conventionally known automatic design method.

As shown in the above embodiment, the present invention can be applied by changing the data of macro table 74 in a part, even when an I/O buffer size, a pad arrangement structure (lattice form, and staggered form), a pad pitch and so on are changed.

The above layout method can realize to arrange the set of the macro and the area I/O automatically in the optional location on the chip 1 easily. Also, by arranging other macros 4 and basic cells (not illustrated) in a gate area 5, and by using the peripheral I/O 2 and the area I/O 3, it is possible to increase the number of I/O buffers or the number of the signals while restraining the dead space. It should be noted that I/O to be combined with the macro 4 may be a peripheral I/O 2.

As described above, in the present invention, the area I/O 3 and the macros 4 are arranged in optional locations on the chip 1 (for example, locations to be desired on the design such as a circumferential portion or a center portion, locations in the neighborhood of a predetermined element, locations far from a predetermined element as much as possible) without predetermined locations to be arranged. In this case, the present invention is applicable even when the size of the I/O buffer, the arrangement structure of pads (a lattice form, a staggered form), and a pad pitch on the chip are changed.

Also, the semiconductor integrated circuit device of the present invention is further composed of a peripheral I/O (2) containing a plurality of I/O buffers provided in the circumferential portion. Also, in the semiconductor integrated circuit device of the present invention, the macro 4 is combined with at least one of the area I/Os 3 to be used for the macro 4 and is provided in an optional location. That is, the macro 4 is combined with the area I/O 3 for the macro 4 and the area I/O 3 contains an I/O buffer, a signal pad, a power supply pad for the I/O buffer, a ground pad for the I/O buffer and a connection wiring line. The set of the macro 4 and the I/O is arranged in the optional location on the chip (1).

According to the present invention, a peripheral I/O area, an area I/O area, a wiring line area and so on are not predetermined and a macro and an area I/O are arranged in optional locations using the set of the macro and the area I/O. Therefore, it is possible to improve the degrees of freedom of the design.

Also, according to the present invention, a peripheral I/O area and an area I/O area are not predetermined, an area can be optionally adjusted according to the necessity, and the design can be carried out to reduce a dead space which is easy to generate when they are previously determined. Therefore, it is possible to increase the number of I/O buffers or the number of the signals, while the generation of the dead space on the chip is restrained and the increase of the substrate area is restrained.

What is claimed is:

1. A semiconductor integrated circuit device comprising:
   macros arranged in optional locations of a first empty area of a gate area in a center portion of a chip, respectively; and
   area I/Os, each of which contains a plurality of area I/O buffers, and is arranged in an optional location of a second empty area of a total area of said gate area and a buffer area in a circumferential portion of said chip, each of said plural area I/O buffers interfaces with an external block outside of the chip through a pad,
   wherein a first macro of said macros is connected with a specific one of said area I/Os.

2. The semiconductor integrated circuit device according to claim 1, wherein said specific area I/O is related to said first macro and is arranged in relation to a location for said first macro to be arranged.

3. The semiconductor integrated circuit device according to claim 1, further comprising:
   a peripheral I/O provided in a fixed area of said buffer area, and containing a plurality of peripheral I/O buffers,
   wherein a specific one of said plurality of peripheral I/O buffers is connected with a second macro of said macros.

4. The semiconductor integrated circuit device according to claim 1, further comprising:
   a plurality of logic gates provided in optional locations of said first empty area of said gate area.

5. The semiconductor integrated circuit device according to claim 1, wherein each of said macros is arranged depending on one of signal processing speed, heat generated in said chip during an operation of said semiconductor integrated circuit device, and connection relation between said macro and remaining macros.

6. A design apparatus of a semiconductor integrated circuit comprising:
   a macro table which stores macro data and specification data, wherein said macro data specifies each of a plurality of macros, and said specification data specifies an area I/O corresponding to each of said plurality of macros, and said area I/O contains a plurality of I/O buffers and is possible to be arranged in an optional location of a first empty area of a gate area and a circumferential portion on a chip, said circumferential portion surrounding said gate area, each of said plural area I/O buffers interfaces with an external block outside of the chip through a pad;
   a selection section which refers to said macro table based on data for specifying each of a plurality of design macros and process data for specifying whether said macro needs to carry out high-speed signal processing, to select a high-speed processing macro and said area I/O related to said high-speed macro; and
   a layout design section which arranges said high-speed processing macro and said area I/O in predetermined locations on a chip such that said high-speed macro is arranged in a second empty area of said gate area and said area I/O is arranged in said first empty area of said gate area and said buffer area.

7. The design apparatus of the semiconductor integrated circuit according to claim 6, wherein said area I/O contains the number of I/O buffers in said area I/O, an arrangement of the I/O buffers and an optimal arrangement of said area I/O and said high-speed processing macro.

8. A layout method of a semiconductor integrated circuit device, comprising:
   selecting a high-speed processing macro, in which a signal needs to be processed at high speed, and an area I/O related to said high-speed processing macro based on design macro data of each of a plurality of design macros to be laid-out and specification data for specifying whether said design macro is said high-speed processing macro; and
   arranging said high-speed processing macro and said area I/O on a chip which has a gate area in a center portion and a buffer area in a circumferential portion, each of plural area I/O buffers of said area I/O interfaces with an external block outside of the chip through a pad.

9. The layout method of the semiconductor integrated circuit device according to claim 8, wherein said selecting step includes:
   referring to a macro table based on said design macro data and said specification data to select said high-speed processing macro and said area I/O,
   wherein said macro table stores macro data and specification data, wherein said macro data specifies each of a plurality of macros, and said specification data specifies an area I/O corresponding to each of said plurality of macros.

10. The layout method of the semiconductor integrated circuit device according to claim 8, wherein said area I/O contains the number of I/O buffers in said area I/O, an arrangement of the I/O buffers and an optimal arrangement of said area I/O and said high-speed processing macro,
    said arranging step includes:
    arranging said high-speed processing macro in a first empty area of said gate area and said area I/O is arranged in a second empty area of said gate area and said buffer area based on said optimal arrangement.

11. A software product executable by a computer for a layout method of a semiconductor integrated circuit device, said layout method comprising:
    selecting a high-speed processing macro, in which a signal needs to be processed at high speed, and an area I/O related to said high-speed processing macro based on design macro data of each of a plurality of design macros to be laid-out and specification data for specifying whether said design macro is said high-speed processing macro; and
    arranging said high-speed processing macro and said area I/O on a chip which has a gate area in a center portion and a buffer area in a circumferential portion, each of plural area I/O buffers of said area I/O interfaces with an external block outside of the chip through a pad.

12. The software product according to claim 11, wherein said selecting step includes:
    referring to a macro table based on said design macro data and said specification data to select said high-speed processing macro and said area I/O,
    wherein said macro table stores macro data and specification data, wherein said macro data specifies each of a plurality of macros, and said specification data specifies an area I/O corresponding to each of said plurality of macros.

13. A semiconductor integrated circuit device comprising:
    macros arranged in optional locations of a first empty area of a gate area in a center portion of a chip, respectively;
    area I/Os, each of which contains a plurality of area I/O buffers, and is arranged in an optional location of a second empty area of a total area of said gate area and a buffer area in a circumferential portion of said chip, each of said plural area I/O buffers interfaces with an external block outside of the chip through a pad,; and a peripheral I/O provided in a fixed area of said buffer area, and containing a plurality of peripheral I/O buffers, wherein a first macro of said macros is connected with a specific one of said area I/Os, and a specific one of said plurality of peripheral I/O buffers is connected with a second macro of said macros.

14. The semiconductor integrated circuit device according to claim 13, wherein said specific area I/O is related to said first macro and is arranged in relation to a location for said first macro to be arranged.

15. The semiconductor integrated circuit device according to claim 13, further comprising:

a plurality of logic gates provided in optional locations of said first empty area of said gate area.

16. The semiconductor integrated circuit device according to claim 13, wherein each of said macros is arranged depending on one of signal processing speed, heat generated in said chip during an operation of said semiconductor integrated circuit device, and connection relation between said macro and remaining macros.

* * * * *